US006659827B2

(12) United States Patent
Kim

(10) Patent No.: US 6,659,827 B2
(45) Date of Patent: Dec. 9, 2003

(54) METHOD FOR MANUFACTURING ORGANIC EL DEVICE

(75) Inventor: Seon-Hee Kim, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 62 days.

(21) Appl. No.: 09/931,244

(22) Filed: Aug. 17, 2001

(65) Prior Publication Data

US 2002/0021089 A1 Feb. 21, 2002

(30) Foreign Application Priority Data

Aug. 17, 2000 (KR) .......................... 2000-47590

(51) Int. Cl.⁷ ................. H01J 9/24; H01J 1/62
(52) U.S. Cl. .................................. 445/24
(58) Field of Search .................... 445/24; 313/505

(56) References Cited

U.S. PATENT DOCUMENTS 5,536,616 A * 7/1996 Frechet et al. ............. 430/191
5,701,055 A * 12/1997 Nagayama et al. ......... 313/504
5,883,465 A * 3/1999 Inoguchi et al. ........... 313/509
6,339,288 B1 * 1/2002 Qian et al. ................. 313/498

* cited by examiner

Primary Examiner—Kenneth J. Ramsey
(74) Attorney, Agent, or Firm—McGuireWoods LLP

(57) ABSTRACT

The present invention discloses a method for manufacturing an organic EL device on a transparent substrate including a display region and a non-display region, the display region having pixel regions, includes forming first electrodes, and first and second leads on the transparent substrate, the first electrode spaced apart from each other, connected with the first leads, and formed on the display region, the first and second leads formed on the non-display region. Then, a photoresist layer is deposited over the whole surface of the transparent substrate while covering the first electrode. A first mask and a second mask are aligned on the front side and the back side of the transparent substrate. An insulating layer and partition walls are formed on a region of the display region other than the pixel regions and an EL light-emitting layer is formed on the pixel regions. Finally, second electrodes are formed on the EL light-emitting layer. The second electrode is spaced apart from each other and perpendicular to the first electrode and connected with the second lead.

18 Claims, 4 Drawing Sheets

METHOD FOR MANUFACTURING ORGANIC EL DEVICE

BACKGROUND OF THE INVENTION

1. Field of the Invention

The present invention relates to an organic EL device and a method for manufacturing the same.

2. Description of Related Art

An organic EL device includes an anode receiving positive voltages and a cathode receiving negative voltages. The organic EL device also has an EL light-emitting layer that emits light by itself. The EL light-emitting layer emits light by recombining holes transferred from the anode electrode and electrons transferred from the cathode electrode.

Such organic EL devices are recently used in various industrial fields, for example, a back light device for a liquid crystal display (LCD) device, a portable terminal apparatus, an automobile navigator, a computer, a television, and so on because of its rapid response speed, excellent brightness, simple structure, low production costs and light weight.

The organic EL device is manufactured in the following manner. First, indium tin oxide (Transparent Conductive Materials) layer is deposited on a transparent substrate and is patterned into an anode receiving positive voltages. The anode is formed on a display region, but the anode lead and the cathode lead are formed on a non-display region.

A first photoresist layer is deposited over the display region covering the anode electrode. The first photoresist layer goes through a photolithography using a first mask having an opening portion on a location corresponding to pixel regions, to form an insulating layer on a portion of the anode electrode other than portions corresponding to the pixel regions.

Subsequently, a second photoresist is coated to a predetermined thickness on the insulating layer. At this time, an opening portion of a stripe-like shape crossing over the display region is formed on a location corresponding to a space between the cathode leads. On the other location, after aligning a second mask with the second photoresist, the second photoresist is exposed to light and is later developed to form partition walls having an inverted trapezoid shape. At this point, the second photoresist is made of a different material from the first photoresist.

Thereafter, an organic material is deposited on the display region to form the EL light-emitting layer on an exposed surface of the anode electrode. A metal layer is deposited on the display region to form the cathode electrode between the partition walls. At this point, the pixel regions are where the EL light-emitting layer and the cathode layer are sequentially stacked on the anode electrode. As a result, most components of the organic EL device are completed.

Manufacturing the organic EL device using the above-described method, requires lengthy processing time, resulting in a low productivity, because a photolithography process such as the photoresist coating process, a light exposure process, a development process is performed both in forming the insulating layer and in forming the partition walls

SUMMARY OF THE INVENTION

To overcome the above-describe problems, preferred embodiments of the present invention provide a method for manufacturing on organic EL device in a short processing time.

It is another object of the present invention to provide an organic EL device having a low production cost.

It is also another object of the present invention to provide an organic EL device with high productivity.

In order to achieve the above object, the preferred embodiments of the present invention provide a method for manufacturing an organic EL device on a transparent substrate including a display region and a non-display region, the display region having pixel regions, including: forming first electrodes, and first and second leads on the transparent substrate, the first electrode spaced apart from each other, connected with the first leads, and formed on the display region, the first and second leads formed on the non-display region; depositing a photoresist over the whole surface of the transparent substrate while covering the first electrode; aligning first and second mask while interposing the transparent substrate therebetween; forming an insulating layer and partition walls on a region of the display region other than the pixel regions; forming an EL light-emitting layer on the pixel regions; and forming second electrodes on the EL light-emitting layer, the second electrode spaced apart from each other and perpendicular to the first electrode and connected with the second leads.

The photoresist is a chemically amplified resist. Forming an insulating layer and partition walls includes exposing the photoresist to an UV light through the first and second masks; and immersing the photoresist into a developer. The EL light-emitting layer includes the hole transport layer, the luminescent layer, and the electron transport layer. The first electrode is made of indium tin oxide. The photoresist further includes an ultraviolet absorbing agent.

The method for manufacturing the organic EL device according to the preferred embodiment of the present invention has the following advantages. Since the insulating layer and the partition wall are formed through one photolithography process, the manufacturing process is simplified, and the processing time becomes short, leading to a high productivity. Also, the insulating layer and the partition wall are formed using the same photoresist, the production cost becomes lowered.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFFERED EMBODIMENTS

Figure 1:
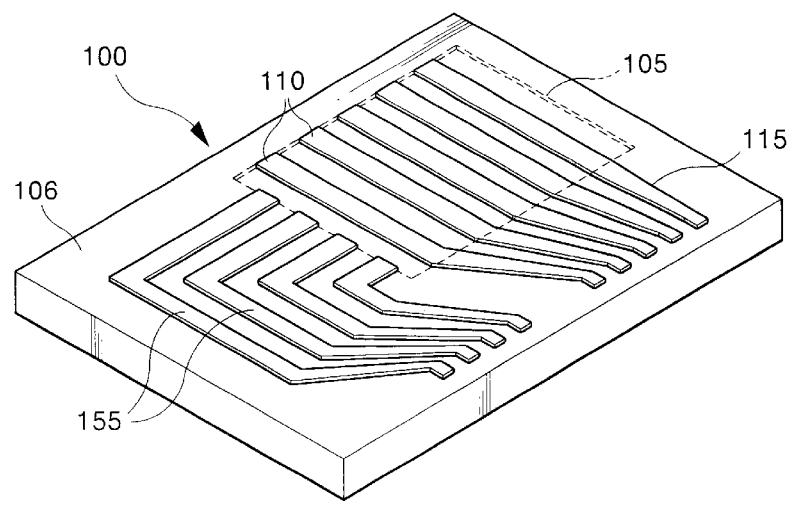
FIG. 1 is a perspective view illustrating a substrate having anode electrode patterns, and anode and cathode lead patterns according to the preferred embodiment of the present invention.

Reference will now be made in detail to preferred embodiments of the present invention, example of which is illustrated in the accompanying drawings.

A configuration of an organic EL device according to the preferred embodiment of the present invention is explained with reference to FIGS. 1 to 7. The anode electrodes 110 of a stripe-like shape are formed on a display region 105 and are spaced apart from each other. The anode leads 115 are formed on one side portion of a non-display region 106. Each of the anode leads is connected with the corresponding anode electrode 105. The cathode leads 155 are formed on other side portion of the non-display region 106 perpendicular to the anode leads 115. An insulating layer 123 is formed on portions of the anode electrodes 110 except for portions of the anode electrode that the cathode leads 155 imaginally extend to overlap. Partition walls 125 of an inverted trapezoid shape with a predetermined height are formed on portions of the insulating layer corresponding spaces between the adjacent two cathode leads 155. The partition walls 125 have a stripe-like shape and are disposed perpendicular to the anode electrode 110. An EL light-emitting layer 140 emitting light by itself is formed on an exposed surface of the anode electrode on which the insulating layer 120 is not formed. The EL light-emitting layer 140 includes a hole transport layer 141 transferring hole injected from the anode electrode 110 to a luminescent layer 143, the luminescent layer 143 emitting light due to an electric current flow, and an electron transport layer 145 transferring electrons injected from the cathode electrode 150 to the luminescent layer 143. The cathode electrodes 150 applying negative voltages to the EL light-emitting layer 140 are formed between the adjacent two partition walls. Each of the cathode electrodes 150 is connected with the corresponding cathode lead 155. A pixel 160 is defined by a region that the EL light-emitting layer 140 and the cathode electrode 150 are sequentially stacked on the anode electrode 110.

A method for manufacturing the organic EL device having such a configuration is explained in detail hereinafter referring to FIGS. 1 through 6. First, as shown in FIG. 1, a transparent metal layer is deposited on the transparent substrate 100 by vacuum deposition and is patterned into the anode electrode 110, and the anode and cathode leads 115 and 155 using the photolithography and etching process. Preferably, the transparent metal layer is made of indium tin oxide.

Figure 2:
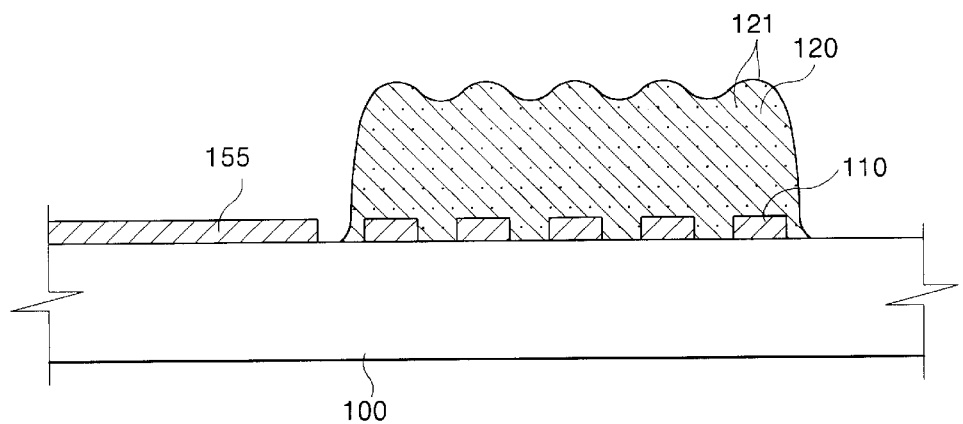
FIG. 2 is a cross-sectional view illustrating a process of depositing a photoresist according to the preferred embodiment of the present invention.

Thereafter, as shown in FIG. 2, a photoresist is coated thick over the whole surface of the substrate 100. The photoresist is a chemically amplified resist 120 including a cross linker, a photo acid generator, and a resin. The chemically amplified resist 120 further includes ultraviolet absorbing agent 121 that absorbs ultraviolet ray of short wavelength to control the thickness and shape of the insulating layer 123 and the partition wall 125. The photoresist 120 used in the preferred embodiment of the present invention is negative but is not limited to the negative photoresist. However, the positive photoresist may be used by modifying first and second mask pattern that will be explained later.

Figure 3:
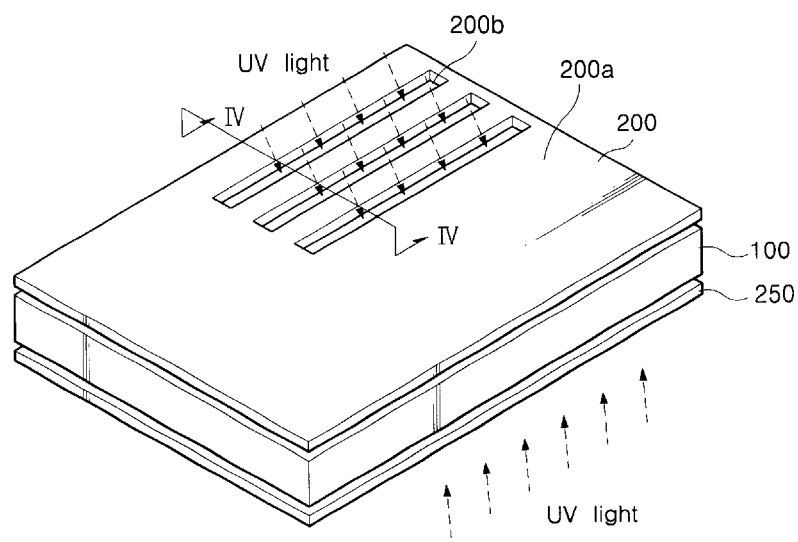
FIG. 3 is a perspective view illustrating a light exposure process according to the preferred embodiment of the present invention.
Figure 4:
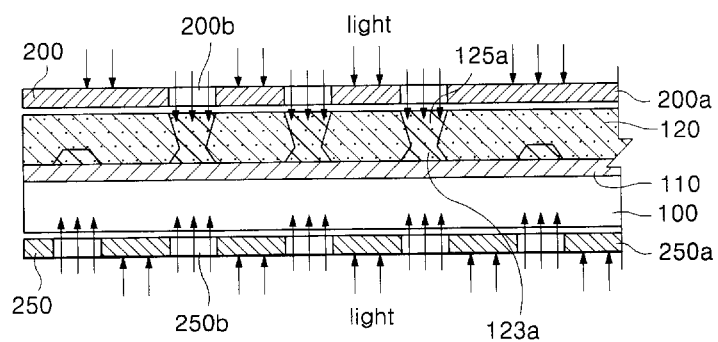
FIG. 4 is a cross-sectional view taken along line IV—IV of FIG. 3.
Figure 5:
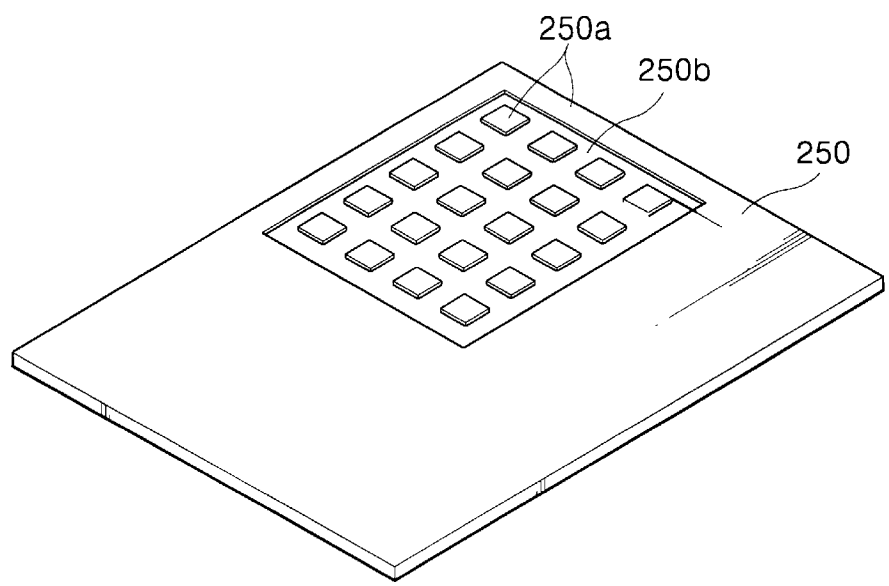
FIG. 5 is a perspective view illustrating a second mask for use in the light exposure process of FIG. 3.

Subsequently, as shown in FIG. 3, a first mask 200 to form the partition wall is aligned over the chemically amplified resist 120, and a second mask 250 to form the insulating layer is aligned under the substrate 100. At this point, the first mask 200 has a light shielding portion 200a for shielding light and a light transmitting portion 200b for transmitting light. The light transmitting portion 200b of the first mask 200 corresponds to the partition walls 125. Also, the second mask 250, as shown in FIG. 4, has a light shielding portion 250a for shielding light and a light transmitting portion 250b for transmitting light. The light shielding portion 250a is a portion that corresponds to the pixel regions 160 and the non-display region 106, and the light transmitting portion 223a is a portion that corresponds to a portion of the display region 105 except for the pixel regions 160. In other words, the partition walls 125 are formed through the first mask 200, and the insulating layer 123 is formed through the second mask 250. FIG. 5 is a perspective view illustrating the second mask 250.

After aligning the first and second masks 200 and 250, the chemically amplified resist 120 is subjected to a light exposure, preferably, by UV light of short wavelength as shown in FIG. 4, which is a cross-sectional view taken along line IV—IV of FIG. 3.

At this time, a front light exposure using the first mask 200 and a back light exposure using the second mask 250 are performed simultaneously or sequentially. The UV light passing through the light transmitting portions 200b and 250b reacts with the chemically amplified resist 120, so that a molecule structure of the chemically amplified resist 120 is changed not to be melted by a developer. In other words, when exposed to the UV light, the photo acid generator contained in the chemically amplified resist 120 generates an acid cross linker having many functional groups reacts on an acid, increases the molecule amount of the resin sufficiently not to be melted by the developer.

Figure 6:
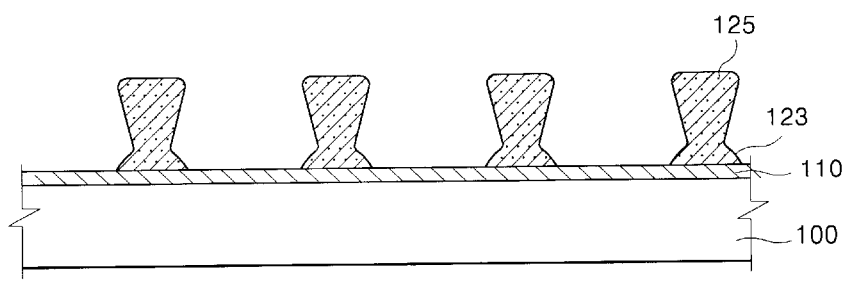
FIG. 6 is a cross-sectional view illustrating a state that an insulating layer and partition walls are formed.

An amount of the UV light of short wavelength passing through the light transmitting portion 200b of the first mask 200 is gradually reduced as it gets farther from the masks 200. Therefore, the partition walls that will be formed in subsequent process get to have an inverted taper shape or inverted trapezoid shape as shown in FIG. 6. Also, of the UV light passing through the light transmitting portion 250b of the second mask 250, a small amount of the UV light reaches the chemically amplified resist 120 while passing through the substrate 100 and the anode electrode 110, and is absorbed by the chemically amplified resist 120. As a result, the UV light of short wavelength does not reach a front surface of the chemically amplified resist 120. Thus, the insulating layer 123 is formed to have a good taper angle (i.e., more than 450) on a bottom surface of the chemically amplified resist 120 adjacent to the anode electrode 110 in a subsequent process. A thickness and a shape of the insulating layer 123 and the partition wall 125 can be controlled by the kind and amount of the ultraviolet absorbing agent.

Then, the array substrate undergoing the light exposure is immersed into a developer to be developed, so that the insulating layer 123 and the partition wall 125 are simultaneously formed as shown in FIG. 6. Since the insulating layer 123 is thinner than the partition wall 125, the insulating layer 123 has an almost rectangular cross-sectional shape and is formed on a portion of the display region 105 other than the pixel region 106. Also, the partition walls 125 have a cross-section of an inverted trapezoid shape and are formed on a portion of the display region 105 corresponding to spaces between the adjacent two cathode leads 155 and cross over the anode electrodes 110 perpendicularly. A thickness ratio between the insulating layer 123 and the partition wall 125 is one to four. For example, when the insulating layer 123 is 1 m thick, the partition wall 125 is 4 μm thick.

Figure 7:
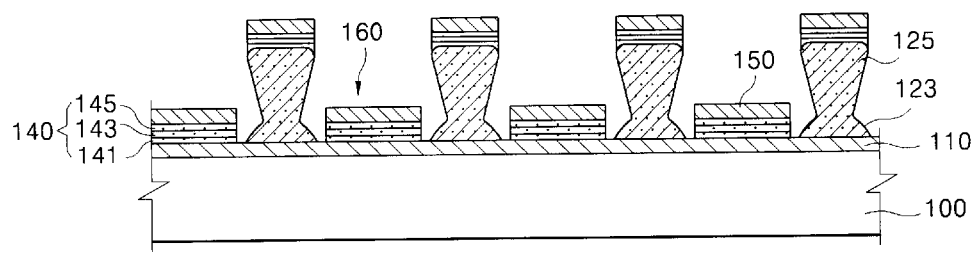
FIG. 7 is a cross-sectional view illustrating an organic EL device according to the preferred embodiment of the present invention.

Subsequently, using a third mask (not shown) having a light transmitting portion that corresponds to the pixel region 160, the EL light-emitting layer 140 is formed on the exposed surface of the anode electrode 110 as shown in FIG. 7. The EL light-emitting layer 140 includes the hole transport layer 141, the luminescent layer 143, and the electron transport layer 145. Thereafter, the cathode electrodes 150 having a stripe-like shape are formed on the EL light-emitting layer 140 and cross over the anode electrode 110. Each of the cathode electrodes 150 is connected to the corresponding cathode lead 155. Therefore, the organic EL device according to the preferred embodiment of the present invention is completed.

As described herein before, the method for manufacturing the organic EL device according to the preferred embodiment of the present invention has the following advantages. Since the insulating layer and the partition wall are formed through one photolithography process, the manufacturing process is simplified, and the processing time becomes short, leading to a high productivity. Also, the insulating layer and the partition wall are formed using the same photoresist, lowering the production cost.

While the invention has been particularly shown and described with reference to preferred embodiments thereof, it will be understood by those skilled in the art that the foregoing and other changes in forms and details may be made therein without departing from the spirit and scope of the invention.

What is claimed is:

1. A method for manufacturing an organic EL device on a transparent substrate including a display region and a non-display region, the display region having pixel regions, comprising:

forming a first electrode, a first lead and a second lead on the transparent substrate;

depositing a photoresist layer over the entire transparent substrate covering the first electrode;

aligning a first mask on a front side of the transparent substrate;

aligning a second mask on a back side of the transparent substrate;

forming an insulating layer and a plurality of partition walls, the insulating layers being formed on the display region other than the pixel regions of the display;

forming an EL light emitting layer on the pixel regions; and forming a second electrode on the EL light-emitting layer, wherein the first lead and the second lead are formed on the non-display region, and wherein a ratio between a height of the insulating layer and a height of the partition walls is 1:4.

2. The method of claim 1, wherein the photoresist is a chemically amplified resist.

3. The method of claim 1, wherein the step of forming an insulating layer and partition walls further comprises:

exposing the transparent substrate to a light source through the first mask and the second mask; and immersing the transparent substrate into a developer.

4. The method of claim 3, wherein the light source is an ultraviolet ray of short wavelength.

5. The method of claim 3, wherein the transparent substrate is exposed to the light source through the first mask and the second mask simultaneously.

6. The method of claim 3, wherein the transparent substrate is exposed to the light source through the first mask and the second mask sequentially.

7. The method of claim 3, wherein the photoresist further includes an ultraviolet absorbing agent.

8. The method of claim 3, wherein the step of forming an insulating layer and a plurality of partition walls comprises:

passing UV light from a first direction through light transmitting portions of the second mask, wherein the light transmitting portions of the second mask correspond to portions of the display region other than the pixel regions; and passing UV light from a second direction through light transmitting portions of the first mask, and immersing the transparent substrate into the developer, wherein the light transmitting portions of the first mask correspond to portions of the display region corresponding to spaces between the plurality of second leads.

9. The method of claim 8, wherein light is passed from the first direction and the second direction occur at a same time and the partition walls and insulating layer are developed substantially simultaneously.

10. The method of claim 8, wherein light is passed from the first direction before or after light is passed from the second direction.

11. The method of claim 8, wherein the step of forming the insulating layer and a plurality of partition walls further comprises immersing the transparent substrate into a developer.

12. The method of claim 1, wherein the first electrode is made of indium oxide.

13. The method of claim 1, wherein the step of forming a plurality of partition walls and the step of forming an insulating layer occur substantially simultaneously.

14. The method of claim 13, wherein the step of forming an insulating layer and a plurality of partition walls occurs during a same lithography process.

15. The method of claim 1, wherein the step of aligning a second mask on a backside of the transparent substrate comprises aligning a second mask having a pattern with plurality islands or a matrix pattern.

16. The method of claim 1, wherein the insulating layer and the plurality of partition walls are formed from the deposited photoresist.

17. The method of claim 1, wherein the plurality of partition walls have an inverted trapezoid shape and the insulating layer has an almost rectangular cross sectional shape.

18. A method for manufacturing an organic EL device on a transparent substrate including a display region and a non-display region, the display region having pixel regions, comprising:

forming a plurality of first electrodes, a plurality of first leads and a plurality of second leads on the transparent substrate;

depositing a photoresist layer over the entire transparent substrate covering the first electrode;

aligning a first mask on a front side of the transparent substrate;

aligning a second mask on a back side of the transparent substrate;

forming, substantially simultaneously, an insulating layer and a plurality of partition walls, the insulating layers being formed on the display region other than the pixel regions of the display;

forming an EL light emitting layer on the pixel regions; and forming a plurality of second electrodes on the EL light-emitting layer, wherein the plurality of first electrodes which are spaced apart from each other are connected to one of the plurality of first leads and are formed on the display region, wherein the plurality of first leads and the plurality of second leads are formed on the non-display region, and wherein the plurality of second electrodes are spaced apart from each other and are perpendicular to the plurality of first electrodes and are connected to one of the plurality of second leads.

* * * * *